United States Patent [19]
Horie et al.

[11] Patent Number: 5,951,923
[45] Date of Patent: Sep. 14, 1999

[54] VAPORIZER APPARATUS AND FILM DEPOSITION APPARATUS THEREWITH

[75] Inventors: Kuniaki Horie, Yamato; Hidenao Suzuki, Fujisawa; Tsutomu Nakada; Fumio Kuriyama, both of Yokohama; Takeshi Murakami, Tokyo; Masahito Abe; Yuji Araki, both of Fujisawa, all of Japan

[73] Assignee: Ebara Corporation, Tokyo, Japan

[21] Appl. No.: 08/861,516

[22] Filed: May 22, 1997

[30] Foreign Application Priority Data

May 23, 1996 [JP] Japan .................................. 8-151587
May 23, 1996 [JP] Japan .................................. 8-151588

[51] Int. Cl.⁶ .................................................. B01F 3/04
[52] U.S. Cl. .................... 261/153; 261/112.1; 261/155; 261/157; 261/DIG. 65
[58] Field of Search .................. 261/112.1, 152, 261/153, 155, 156, 157, 161, DIG. 65

[56] References Cited

U.S. PATENT DOCUMENTS

| | | | |
|---|---|---|---|
| 546,175 | 9/1895 | Mery | 261/153 |
| 834,697 | 10/1906 | Williams | 261/153 |
| 898,935 | 9/1908 | Sladek et al. | 261/153 |
| 1,213,817 | 1/1917 | Baruch | 261/155 |
| 1,284,080 | 11/1918 | Fischer | 261/161 |
| 1,354,484 | 10/1920 | Hoyt | 261/155 |
| 1,814,400 | 7/1931 | Bramley-Moore | 261/155 |
| 2,545,028 | 3/1951 | Haldeman | 261/112.1 |
| 5,204,314 | 4/1993 | Kirlin et al. . | |
| 5,431,736 | 7/1995 | Boer | 261/152 |

FOREIGN PATENT DOCUMENTS

| | | | |
|---|---|---|---|
| 692261 | 11/1930 | France | 261/155 |
| 6-206796 | 7/1994 | Japan . | |
| 6-310444 | 11/1994 | Japan . | |

*Primary Examiner*—C. Scott Bushey
*Attorney, Agent, or Firm*—Wenderoth, Lind & Ponack, L.L.P.

[57] ABSTRACT

A vaporizer apparatus efficiently vaporizes difficult-to-vaporize materials such as complex feed materials for producing a high dielectric or ferroelectric material. The vaporizer apparatus includes a vaporizing passage formed by a pair of opposed walls separated by a minute spacing to a liquid feed entrance provided at one end of the vaporizing passage, a vaporized feed exit provided at an opposite end of the vaporizing passage, and a heating arrangement for heating the walls to a temperature in excess of a vaporizing temperature of the liquid feed so that the liquid feed material may be guided into the vaporizing passage to be vaporized.

45 Claims, 11 Drawing Sheets

F I G. 3A
F I G. 3B
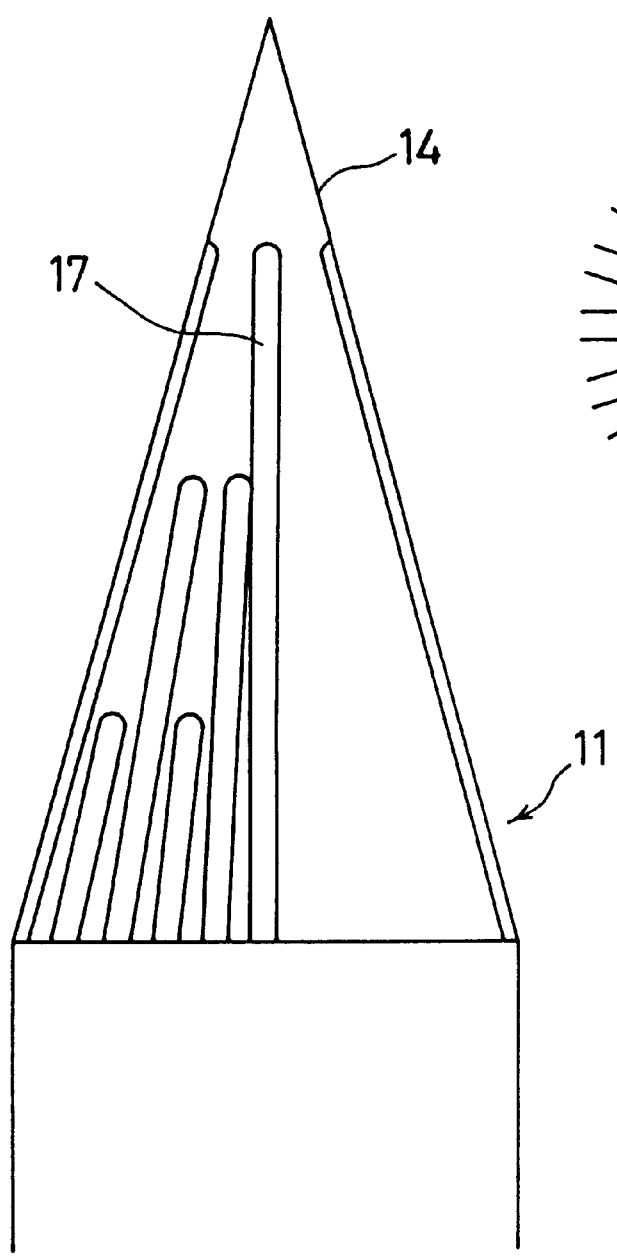
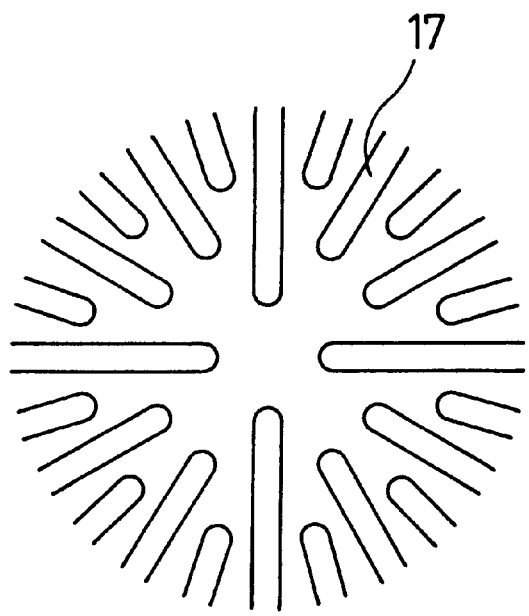

F I G. 6A
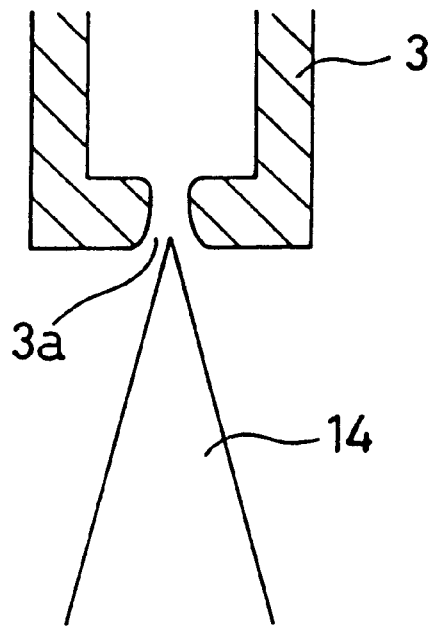
F I G. 6B
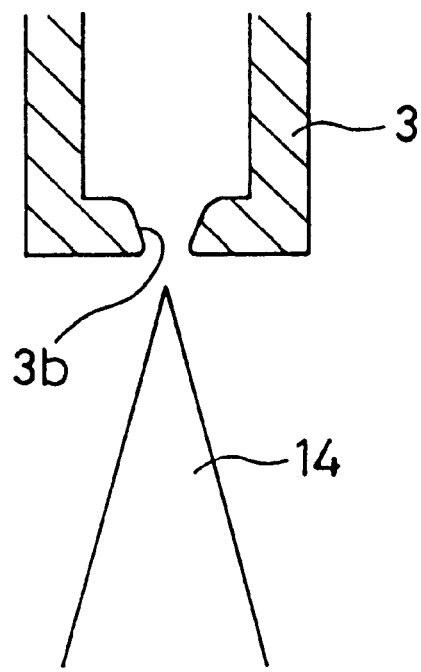

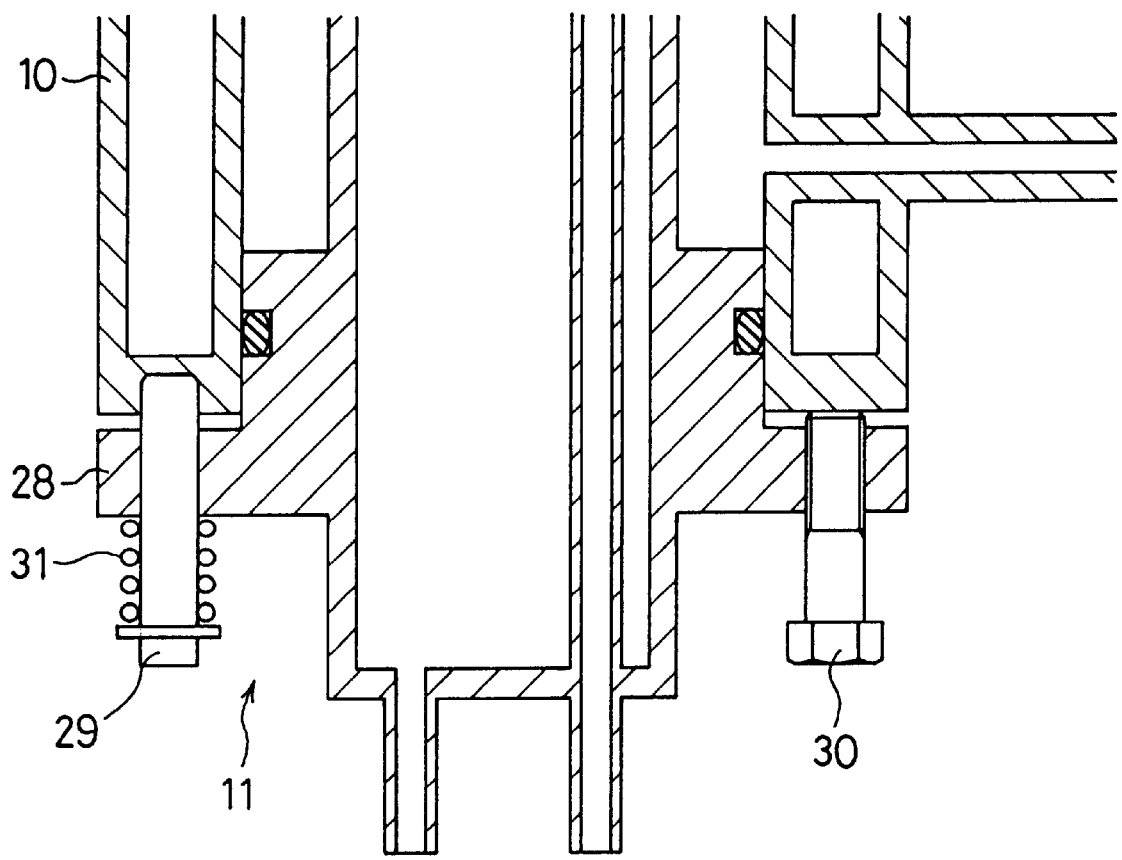

F I G. 1 3
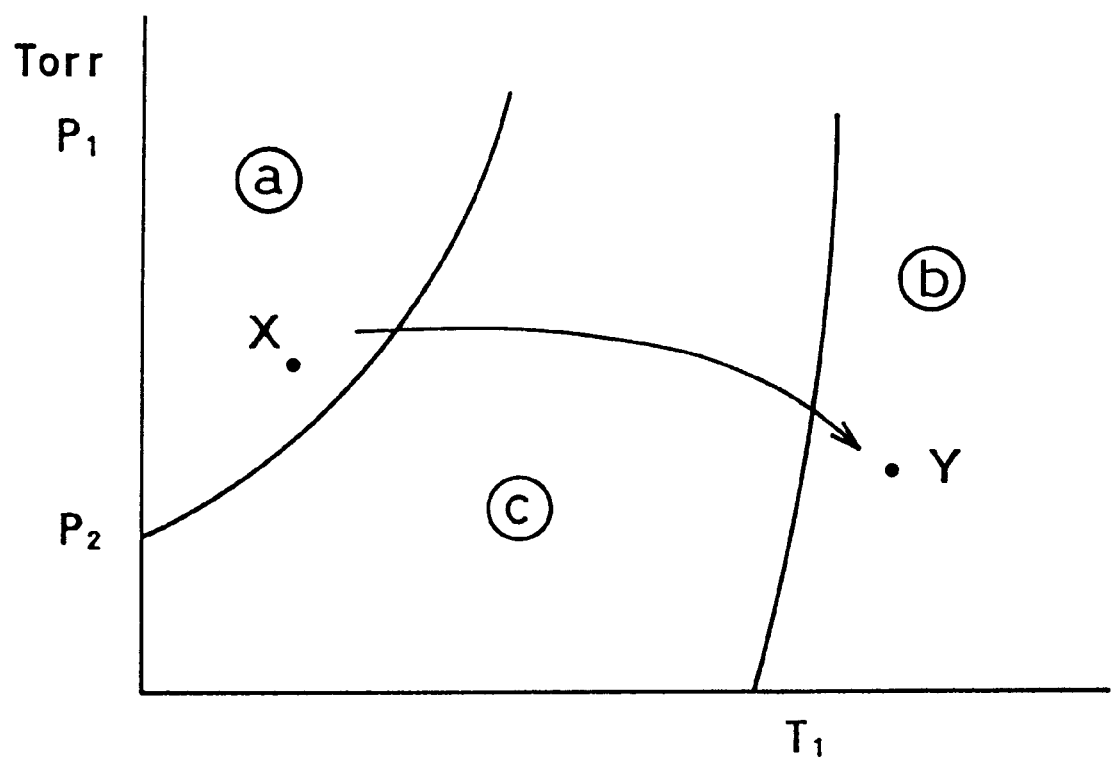

VAPORIZER APPARATUS AND FILM DEPOSITION APPARATUS THEREWITH

BACKGROUND OF THE INVENTION

1. Field of the Invention

The present invention relates in general to a vaporizer apparatus used for growing thin films from a liquid feed material, and relates in particular to a liquid feed vaporizer apparatus suitable for growing high dielectric or ferroelectric films such as barium/strontium titanate.

2. Description of the Related Art

In recent years, there has been a remarkable improvement in circuit density of integrated circuit devices produced by the semiconductor industries, and intense development activities are underway in anticipation of giga-bit order dynamic random access memories (DRAMS) replacing the prevailing mega-bit order DRAMs of today. As dielectric thin film materials used to make high capacitance devices necessary for such highly integrated DRAMs have, newer materials such as barium titanate ($BaTiO_3$) or strontium titanate ($SrTiO_3$) of dielectric constant about 300 or mixtures of these compounds are deemed to be promising, instead of the present dielectric thin film materials including silicon oxide or silicon nitride films of dielectric constant less than 10, tantalum pentaoxide ($Ta_2O_5$) films of dielectric constant less than 20. Materials with even higher dielectric constants such as PZT, PZLT and Y1 are also promising.

Of the various methods of making such thin films, prospects are particularly bright for the chemical vapor deposition (CVD) process, and in this case, it is necessary that a feed gas must be supplied in a stable gas stream to a substrate disposed in a film deposition chamber. In order to stabilize the vaporization characteristics, the feed gas is derived by heating for vaporization a liquid source produced by dissolving materials such as $Ba(DPM)_2$ or $Sr(DPM)_2$, which are solid at normal temperature, in some organic solvent such as THF.

It is extremely difficult to stably vaporize feed materials of highly dielectric materials described above because: (1) vaporization and decomposition temperatures are close together; (2) a difference exists in the vaporization temperatures between the film material and the organic solvent; and (3) the vapor pressures are all very low. For example, for a liquid feed made by dissolving $Ba(DPM)_2$ or $Sr(DPM)_2$ in THF, the liquid phase of the solvent ranges in the region marked as "a" in FIG. 13, and the liquid or solid phase of the material ranges in "a+c". Therefore, when raising the temperature of the liquid through the region marked "c" to vaporize the liquid feed which is in "a", there is a danger that only the solvent is evaporated, causing the film material to precipitate out and resulting in plugging of a vapor passage or degradation in the feed quality due to compositional changes.

Therefore it is generally considered that, when vaporizing a liquid feed material, it is necessary to rapidly heat the liquid to bring it quickly to the high temperature region. A known type of vaporizer apparatus utilizes a technology of first preparing atomized mist with the use of an ejector nozzle or ultrasonic vibrator, and then heating the mist in a high temperature region to produce a vapor.

Also, depending on the type of film to be produced, it is sometimes necessary to supply the feed at infinitesimally slow rates to the film growing chamber. When using an ejector nozzle to atomize a liquid, a carrier gas is delivered at fairly high pressures and it is difficult to atomize a minute quantity of process liquid. When using an ultrasonic atomizer, it has been difficult to find an ultrasonic element which can operate at high temperatures required to vaporize the feed, so that it is difficult to carry out atomization under stable conditions. Also, both atomization and spraying processes require a large space, and there is a danger that some of the feed material can become stagnant in the space and become degraded or cannot be reliably delivered to the vaporizer apparatus.

Furthermore, it is desirable that the feed vaporization step be carried out just before the vapor enters into the processing chamber so as to make the vapor transport passage as short as possible, and it is desirable that the apparatus be efficient enough to vaporize a necessary amount of liquid feed in a small space. But the conventional apparatus based on a two-step process of atomizing followed by vaporization requires a large space and cannot easily be made into a compact unit.

Therefore, it is evident that there has been a need for improving the current system of treating difficult-to-vaporize materials in such a way that, even at infinitesimal rates of supply of liquid feed, the apparatus works efficiently and precisely so that the required vapor can be supplied to the vaporizer apparatus in a stable state.

SUMMARY OF THE INVENTION

It is an object of the present invention to provide a vaporizer apparatus which can be used to efficiently vaporize difficult-to-vaporize materials such as complex feed materials for producing a high dielectric or ferroelectric material. Another object of the present invention is to provide a compact vaporizer apparatus which can vaporize a minute quantity of material under controlled conditions of temperature and composition without causing plugging or clogging of the vapor transport passage.

These objects have been achieved in a vaporizing apparatus for producing a vapor of a liquid feed material comprising: a vaporizing passage comprised by a pair of opposed walls separated by a minute spacing; a liquid feed entrance provided at one end of the vaporizing passage; a vaporized feed exit provided at an opposite end of the vaporizing passage; and heating means for heating the walls to a temperature in excess of a vaporizing temperature of the liquid feed so that the liquid feed material may be guided into the vaporizing passage to be vaporized.

Accordingly, the liquid feed material is retained between the wall surfaces as a thin film so that this film can be rapidly heated by the heated walls to its vapor temperature. Because the feed is supplied quickly to the vaporizer section in a liquid form, there is no stagnancy in the feed flow path, and an excellent control over the supply rate can be exercised even at an infinitesimal rate of supply. The liquid feed enters the vaporizer section which is wide at the inlet end and is gradually expanding towards the outlet end.

In one aspect of the invention, at least one wall of the walls may be provided with grooves to enable a vaporized gas and/or a carrier gas to flow through. Accordingly, the partial pressure of the process gas is reduced, thereby promoting further vaporization of the liquid feed. The vaporized gas is outputted from the grooves while the liquid feed is retained and heated in the minute spacing, and the gas phase can be removed independently of unvaporized liquid.

The vaporizing passage may include a portion in which the cross sectional areas of the vaporizing passage increases in a vicinity of the vaporized feed exit so that volume expansion accompanying the liquid-to-vapor phase change may be accommodated.

The apparatus may be provided with a spacing adjustment mechanism for varying a separation distance of the minute spacing in accordance to the characteristics of the feed material and/or vaporization rate.

The apparatus may be provided with a driving mechanism for operating the spacing adjustment mechanism so that the distance adjustment operation can be carried out even more smoothly.

The liquid feed entrance may be communicated with a carrier gas supply passage for supplying a carrier gas. Accordingly, the step of mixing the process vapor with the carrier gas can be carried out simultaneously within the vaporizer section to improve the efficiency of the apparatus. Mixing with the carrier gas reduces the partial pressure of the process gas and enhances the vaporization process.

The vaporizing passage may be comprised by a pair of rotation surfaces opposing to each other. For example, the rotation surface may comprise a conical shape, a cylindrical shape, or any other shape and some combination thereof. By forming the vaporizing passage by a pair of rotation surfaces, the opposed walls as well as the heating means can be formed small to provide a compact and efficient vaporizer apparatus. It is also possible to cancel the disparities in dimensions by adjusting the mutual centering axis so as to enhance the vapor forming process. The configuration can also facilitate gas exhaustion through the grooves, which further creates a newly exposed surface of the vaporizing passage to promote thermal transfer and improves the vaporization efficiency.

The vaporizing passage may be defined by a pair of opposed planar members. Accordingly, a simple construction can achieve the intended purpose, and the cost of apparatus and maintenance costs can be lowered.

It is preferable to make the minute spacing to be not more than 0.3 mm. By making the spacing narrow, capillary action becomes effective in spreading the liquid quickly to enhance vaporization. The dimension of the spacing depends on the type of liquid feed being used, but a range of less than 0.3 mm is preferred, more preferably, a range of 0.1~0.2 mm.

The liquid feed entrance may include a feed guide section for guiding the liquid feed material into the vaporizing passage so as to further enhance the introduction of the liquid feed into the minute spacing.

A liquid feed supply passage for supplying liquid feed to the vaporizing passage may have a lower end that opens above the liquid feed entrance by a given distance so that thermal isolation of the supply passage can be promoted.

The wall surfaces may be provided with surface characteristics to promote wettability by the liquid feed material. The surface properties of a wall material itself may be altered by using acid wash or sand blasting, on stainless steel for example, thereby improving wetting as well as increasing the surface area.

It is permissible that the liquid feed entrance is provided above the vaporizing passage and the vaporized feed exit is provided below the vaporizing passage. Accordingly, gravity can be utilized to disperse the liquid between the walls, thus further promoting the vapor forming process.

It is also permissible that the liquid feed entrance and the vaporized gas exit are positioned substantially coaxially.

A related aspect of the apparatus is a method for vaporizing a liquid feed material by supplying the liquid feed material continually into a minute spacing formed in a vaporizing passage comprising a pair of heated wall means by utilizing capillary forces between the liquid feed material and contact surfaces of the vaporizing passage. The capillary forces aid dispersed of the liquid between the walls to enhance the vaporization process.

Another embodiment of the apparatus for vaporizing a liquid feed material comprises: a vaporizing passage having a liquid feed entrance; heating means for heating the vaporizing passage to a temperature in excess of a vaporizing temperature of the liquid feed material; a feed supply passage for supplying the liquid feed material to the vaporizing passage by way of the liquid feed entrance; and an insulation section for maintaining the feed supply passage a temperature low enough to keep the liquid feed material in a stable condition without vaporization. Accordingly, the feed can be transferred from one section to another section with a minimum of thermal interference.

It permissible that the vaporizer apparatus has a constriction between the insulation section and the heating means so that the feed supply rate or vaporized gas pressure can be controlled.

The feed supply passage in the vaporizer apparatus may be disposed so as to be separated from the liquid feed entrance by a specific distance, and the heating means and the insulation section are joined along peripheries surrounding the liquid feed entrance. The insulation section and the heating section are controlled separately to minimize the heat transfer between the two sections.

Another aspect of the apparatus for vaporizing a liquid feed material, to generate a process vapor for introduction into a material processing chamber, comprises: a feed storage for storing the liquid feed material; feed supply means for supplying the liquid feed material, and a feed flow passage, wherein a vaporizer mechanism is disposed in the feed flow passage communicating the feed supply means with the material processing chamber, and a vaporization prevention mechanism is disposed upstream, with respect to a direction of flow of the feed material, of the vaporizer mechanism to prevent the vaporizer mechanism from affecting the liquid feed material.

The vaporization prevention mechanism may include an insulated connection provided in the feed flow passage at position upstream of the vaporizer mechanism.

Another objective of the invention is achieved in a gas ejector apparatus for directing a process vapor to a substrate disposed in a material processing chamber, comprising: a vaporizer section having a flow passage comprised by a pair of opposed walls separated by a minute spacing, a liquid feed entrance provided at one end of the flow passage, a vaporized feed exit provided at an opposite end of the flow passage, and heating means for heating the walls to a temperature in excess of a vaporizing temperature of the liquid feed; and an ejector head for directing a vaporized feed to the substrate; wherein the vaporizer section and the ejector head are integrally assembled to form a thermal unit. Such an apparatus utilizes the best features of the vaporizer apparatus presented above to produce a thermodynamically stable system.

Another aspect of the apparatus for vaporizing a liquid feed material comprises: a feed supply section for supplying the liquid feed material at a predetermined rate while maintaining the liquid feed material at a temperature not exceeding a vaporization temperature; a vaporizer section for vaporizing the liquid feed material by heating the liquid feed material to a temperature in excess of the vaporization temperature, wherein a bridging path, having a minute spacing for continually delivering the liquid feed material, is provided between the feed supply section and the vaporizer section.

Accordingly, the low-temperature feed supply section is thermally separated from the high-temperature vaporizer section to minimize heat transfer and prevents the liquid feed from being at a middle temperature range for a long period of time. Furthermore, the feed is not supplied in droplets but is supplied through a liquid bridge so that even an infinitesimal continuous supply rate can be achieved to avoid compositional fluctuations.

The carrier gas entry may be open to the bridging path for enabling a carrier gas to contact the liquid feed material. By performing the step of mixing the carrier gas with the process vapor simultaneously, before the mixed gas is allowed to enter into the vaporizer section, premature vaporization in the bridging path section can be prevented by a simple construction of the vaporizer apparatus to prevent excess supply of liquid feed into the vaporizer section.

It is also permissible that a spacing adjustment mechanism is provided for varying the size of the minute spacing.

The above apparatus may be provided with a drive mechanism to operate the spacing adjustment mechanism. Accordingly, depending on the physical properties of the liquid feed, the spacing can be customized to facilitate the process.

The vaporizer section may comprise a needle section, and the feed supply section may comprise a small diameter tube for supplying the liquid feed material, where the needle section is disposed adjacent to a tip end of the small diameter tube in the bridging path. The tip end of the small diameter tube has a cylindrical nozzle shape. The inner diameter of the small diameter tube should be not more than 2 mm.

The bridging path in the above apparatus may include a liquid guide section having a decreasing cross sectional area in the downstream direction location.

BRIEF DESCRIPTION OF THE DRAWINGS

FIG. 3A and a 3B are a front view and plan view, respectively, of a needle section of the apparatus which is the critical section shown in FIG. 2.

FIGS. 6A and 6B are similar views of other configurations of the bridging path section.

FIG. 7 is a cross sectional view of another embodiment of the vaporizer apparatus having a spacing adjustment mechanism.

FIG. 13 is a graph showing the physical properties of some liquid feed materials.

DESCRIPTION OF THE PREFERRED EMBODIMENTS

Figure 1:
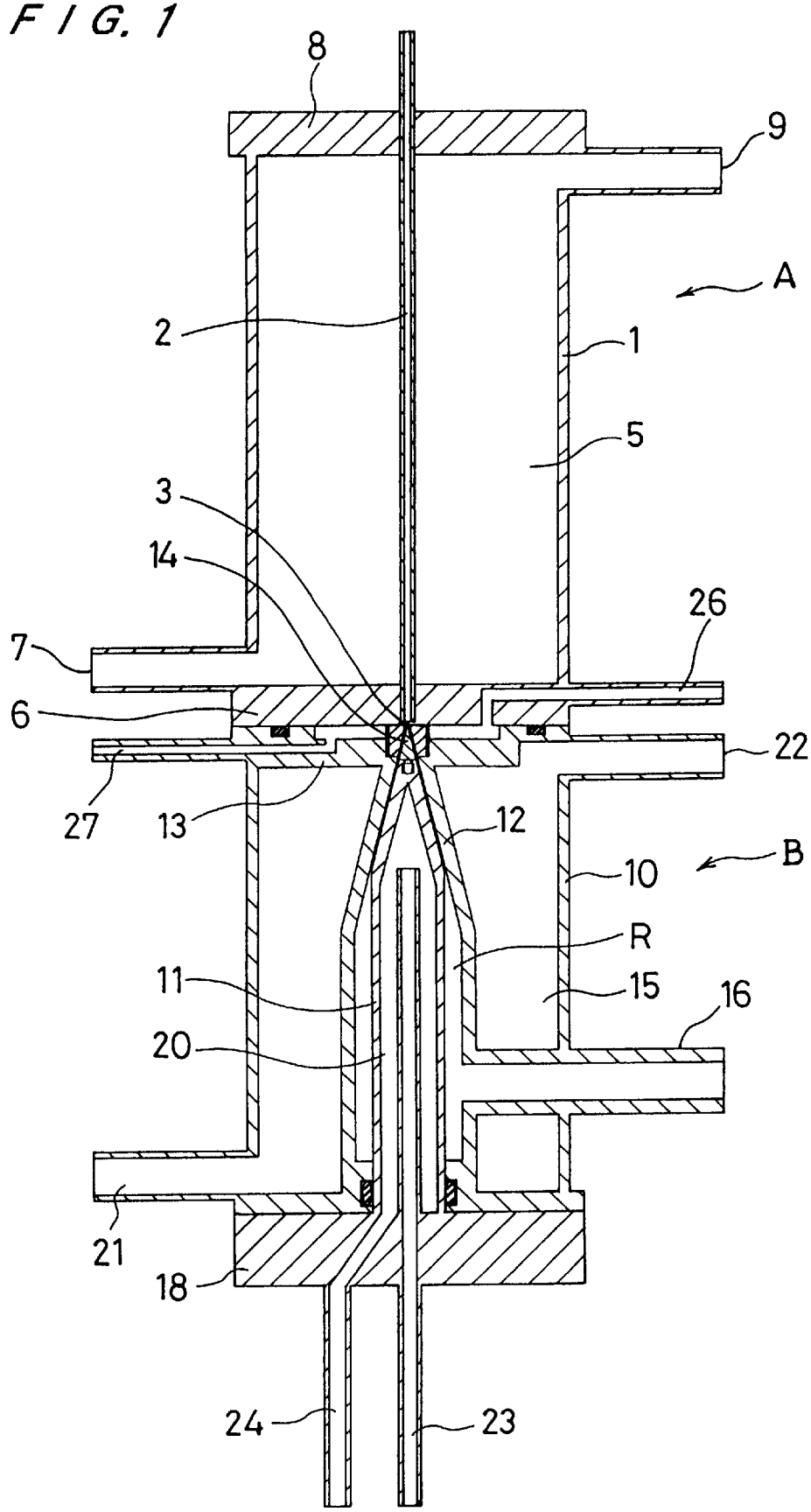
FIG. 1 is a cross sectional view of an overall vaporizer apparatus of the present invention.

In the following, preferred embodiments will be presented with reference to the drawings. FIGS. 1 to 5 relate to a first embodiment comprising an upper section which is a liquid feed supply section A and a lower section which is a vaporizer section B which is attached to the upper section with an intervening thermal insulation section.

The supply section A is a cylindrical container 1 having a liquid feed supply tube 2 extending vertically through its center, and the top portion of the feed supply tube 2 is connected to a feed distribution pipe. A drip nozzle 3 disposed at the tip of the feed supply tube 2, which will be described in detail below, opens to a feed entrance 4 of the vaporizer section B. The interior of the container 1 includes a thermal jacket 5 used to maintain a specific temperature in the feed supply tube 2 where the liquid feed material is in a stable state (for example, region "a" in FIG. 13). A bottom plate 6 of the container 1 has a thermal medium (cooling water) entry opening 7, and a ceiling plate 8 has a medium discharge opening 9.

The vaporizer section B comprises concentrically disposed outer shell section 10 and inner shell section 11 each having its own jacket section. Interior wall 12 of the outer shell section 10 and the inner shell section 11 are constructed in such a way that the top portion of each is cone shaped with a given cone angle, and the bottom potion of each is shaped as a cylinder. A vaporizing passage R for flowing feed material from top to bottom is constituted between the interior wall 12 of the outer shell section 10 and the inner shell section 11. The feed entrance 4 comprises a needle section 14 of the inner shell section 11 arranged in a center opening of the ceiling plate 13 of the outer shell section 10. A liquid feed guide section 4a, for guiding the liquid feed material from the supply section A to the vaporizer section B, is constituted by a ring member positioned between the needle section 14 and the opening of the ceiling plate 13. Vaporized feed exit 16 passes through jacket 15 at the bottom of the outer shell section 10.

The inner and outer shells are made of a material having a good wettability to the liquid feed material, such as stainless steel, and their surfaces are treated with acid washing or sandblasting so as to have a specified surface finish such as surface roughness of about 0.1 mm, for example. Opposing conical surfaces of the outer shell section 10 and the inner shell section 11 form vaporizing passage R with a minute spacing $t_1$ between the shell surfaces. The dimension of $t_1$ can vary depending on the type, temperature and pressure of the liquid feed material. It can be chosen so that the liquid feed continually entering into the minute spacing $t_1$ can spread out immediately between the shell surfaces to form a liquid film by the forces of surface tension (capillary phenomenon) and be heated instantaneously to turn into a vapor.

Figure 4:
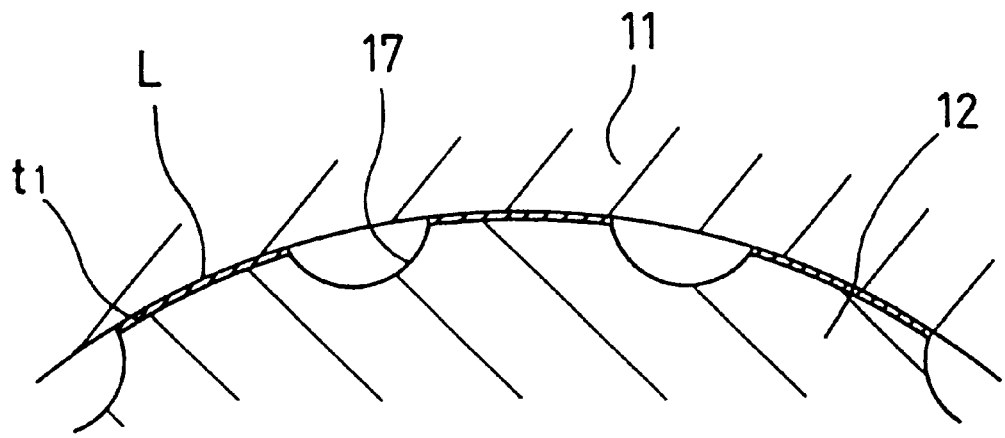
FIG. 4 is an enlarged partial cross sectional view of a vaporizer section for heating liquid and outputting a process gas through grooves.

As shown in FIGS. 3A, 3B and 4, gas flow grooves 17 are formed on the wall of the inner shell side of the vaporizing passage R to facilitate the outflow of the vaporized feed material. These grooves 17 are made to extend along the conical surface, and are designed so that their number or their total cross sectional area increase towards the bottom of the cone. That is, the grooves 17 occupy a larger area in relation to the total surface area of the vaporizing passage R in the downstream region than the upstream region. The design parameters of the gas flow grooves 17, such as their depth and width, can be determined experimentally so that the vaporized feed and a carrier gas can be transported smoothly through the apparatus. For example, if the feed liquid has a low wettability, the number of grooves should be made less or eliminated.

The inner shell section 11 and the outer shell section 10 are connected by fastening a flange 18 formed on the outer surface of the bottom of the inner shell section 11 to the bottom surface of the outer shell section 10 by bolts. The jackets 15, 20 of the outer and inner shell sections 10 and 11 are respectively provided with pipes 21, 22 and 23, 24 for flowing a thermal medium such as oil.

Figure 5A:
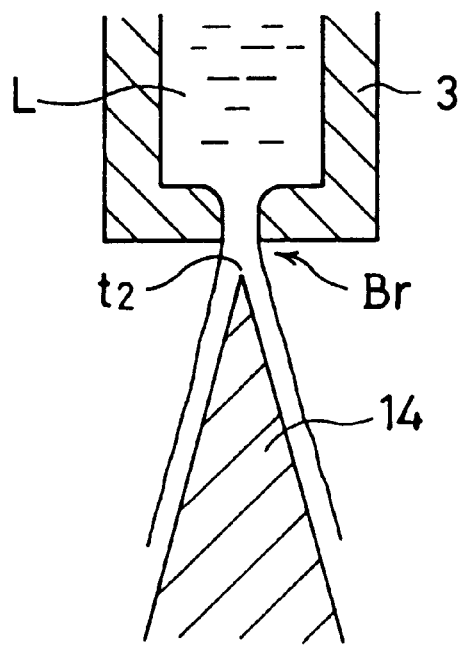
FIGS. 5A and 5B are enlarged side views of different types of bridging paths comprising the nozzle and the needle section shown in FIG. 1.
Figure 5B:
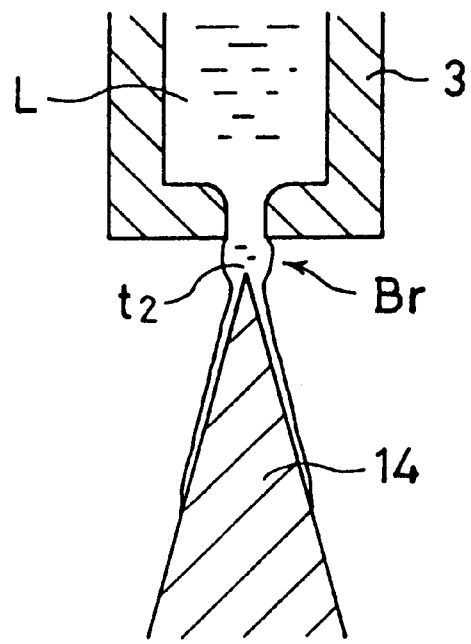

Next, the construction of the connecting section between the supply section A and the vaporizer section B will be described. The bottom plate 6 of the supply section A and the ceiling plate 13 of the vaporizer section B are attached at their peripheries. As shown in FIGS. 5A and 5B, the nozzle 3 at the tip of the liquid feed supply tube 2 is disposed in the immediate vicinity of the needle section 14 of the inner shell section 11, with a certain spacing $t_2$ therebetween. The dimension of the spacing $t_2$ is chosen so that at the minimum necessary rate of supply of the liquid feed material to keep the vaporizer apparatus in operation, the liquid feed material L supplied from the drip nozzle 3 forms a bridging path section (bridging section) Br to the needle section 14 for providing a continuous flow therebetween.

Figure 2:
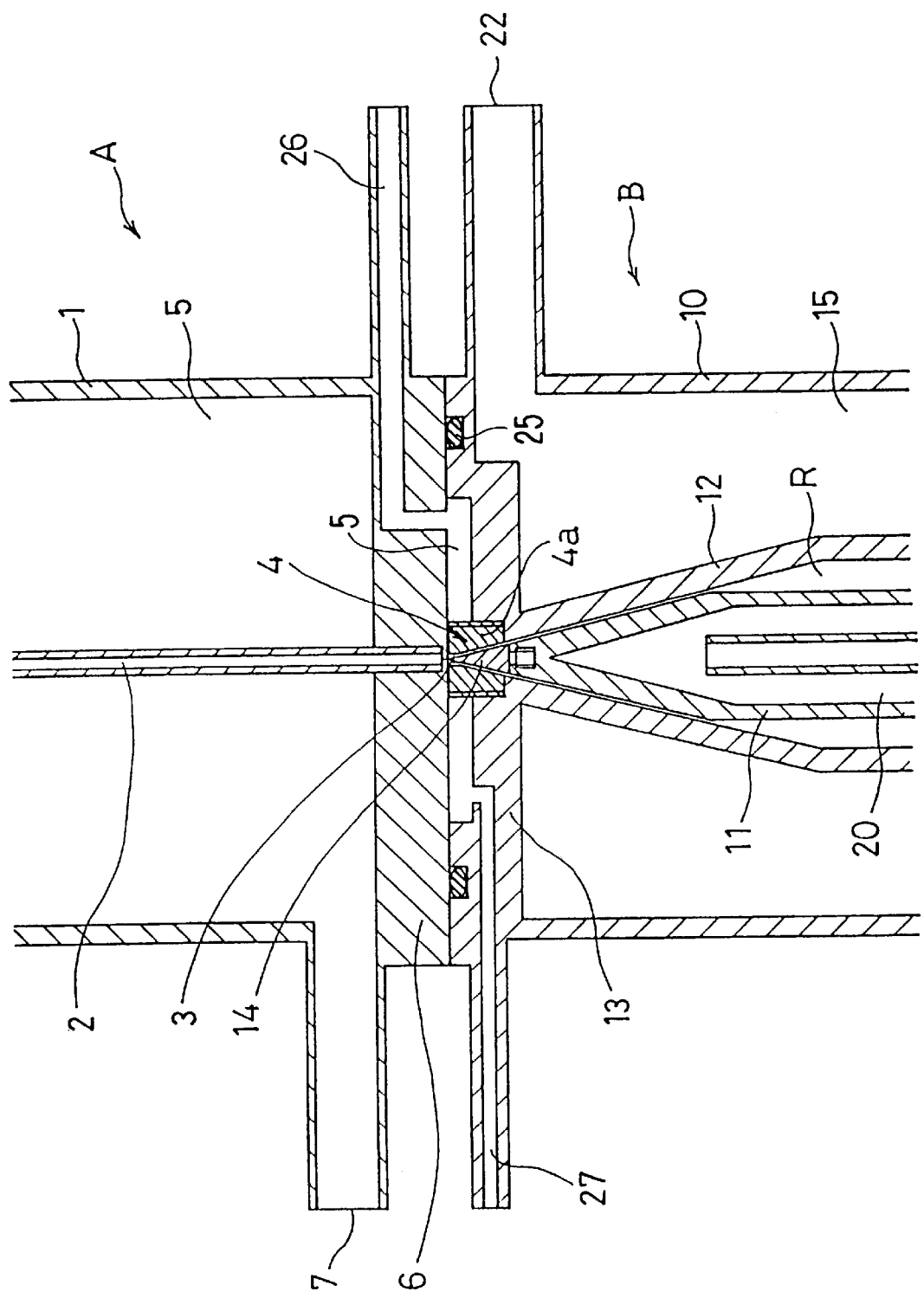
FIG. 2 is an enlarged cross sectional view of the central section of the apparatus shown in FIG. 1.

A space S is provided in a location between the bottom plate 6 of the supply section A and the ceiling plate 13 of the vaporizer section B so as to surround the periphery of the feed entrance 4, and is sealed by a seal member 25 disposed near the edges of the bottom plate 6 and the ceiling plate 13. As shown in FIG. 2, the space S is communicated with carrier gas inlet passages 26, 27 formed either on the ceiling plate 13 of the vaporizer section B or on the bottom plate 6 of the supply section A. The former passage is used to supply a cooled carrier gas, and the latter is used to supply a pre-heated carrier gas. Ring member 4a is threaded to the mouth section of the ceiling plate 13 to surround the nozzle 14 so as to allow adjustment of the size of the spacing (carrier gas passage) formed between the ring member 4a and the bottom plate 6.

In the following, the operation of the liquid feed material vaporizer apparatus will be explained. The jacket 5 of the supply section A is supplied with cooling water at a certain temperature to maintain the temperature of the feed supply tube 2 at a required temperature. This temperature is chosen so that it is in the region within "a" but close to "c" in FIG. 13, for example at a point "x". The liquid feed L flows into the feed supply tube 2 from the feed supply pipe at a controlled flow rate, and is supplied from its bottom end to the feed entrance 4 of the vaporizer section B while being maintained at the required temperature.

At the feed entrance 4, because the drip nozzle 3 and the needle section 14 are spaced at a distance$_2$ to enable a bridging path Br to be formed at all times therebetween, the feed can be supplied without interruption even at infinitesimally small rates. Types of the bridging path section Br formed between the drip nozzle 3 and the needle section 14 are illustrated in FIGS. 5A and 5B. When the feed is supplied at a relatively fast rate, the liquid flows evenly on both ridges as illustrated in FIG. 5A, while when the liquid flow rate is small, the profile of the bridging path section Br assumes a shape illustrated in FIG. 5B, due to surface tension forces. In either case, the feed does not form droplets, thereby eliminating minute fluctuations in vapor volume or the process gas composition.

The carrier gas is supplied to the space S surrounding the feed entrance 4 through the carrier gas passages 26, 27. The carrier gas passes through the guide section 4a surrounding the needle section 14, and carries the material vapor into the gas flow grooves 17 of the inner shell section 11. In the meantime, the liquid feed L supplied to the needle section 14 flows along the surface of the guide section 4a, and enters into the spacing between the inner shell section 11 and the outer shell section 10, as illustrated in FIG. 4. The liquid will flow only into the spacing $t_1$ and will be held therein by the surface tension (capillary phenomenon) without flowing into the grooves 17.

At this stage, the liquid feed L in the spacing $t_1$ is heated by both inner shell section 11 and outer shell section 10, and its wettability is improved, i.e. the surface tension drops, and because the spacing $t_1$ is sufficiently narrow, the low viscosity liquid feed quickly enters into the spacing $t_1$ to be retained therein. The liquid feed L is heated by the wall surfaces to gradually vaporize to enter into the gas flow grooves 17 and is carried by the carrier gas to exit from the vaporized feed exit 16. Since the liquid feed forms a thin film in the narrow spacing $t_1$ when it is heated, the temperature of the feed rises instantaneously through the region "c" to reach the point Y in the vapor region "b" shown in FIG. 13. Therefore, decomposition of the feed material, precipitation of polymerized material or oxidized metals caused by immature vaporization of the solvent is avoided.

Another feature of the apparatus is that the supply section A and the vaporizer section B are joined at the edges by way of a thermal insulation member such as Teflon (polytetrafluorothylene), and the space S is formed inside of the periphery of the apparatus. Thus, the drip nozzle 3 and the needle section 14, the temperatures of which require strict control are less affected by heat conduction so as to easily maintain the temperature constant. By pre-heating the liquid feed in the feed supply tube 2, acting as a insulation section, to a suitable temperature close to the vaporization temperature improves the efficiency of vaporization in the vaporizer section. The temperature control in the insulation section is important, and heat transfer from the vaporizer section should be limited as much as possible.

FIGS. 6A and 6B show other embodiments having different configurations of the drip nozzle 3. The configuration shown in FIG. 6A has a wide-bottomed taper 3a so that the tapered surface forms a parallel opposing surface with the needle section 14 to improve liquid retention. FIG. 6B shows a narrow-bottomed taper 3b so as to prevent spreading out of the feed liquid. The configuration can include a variety of shapes such as curved surfaces of the guide section in conjunction with altered shapes of the needle section 14.

Figure 8A:
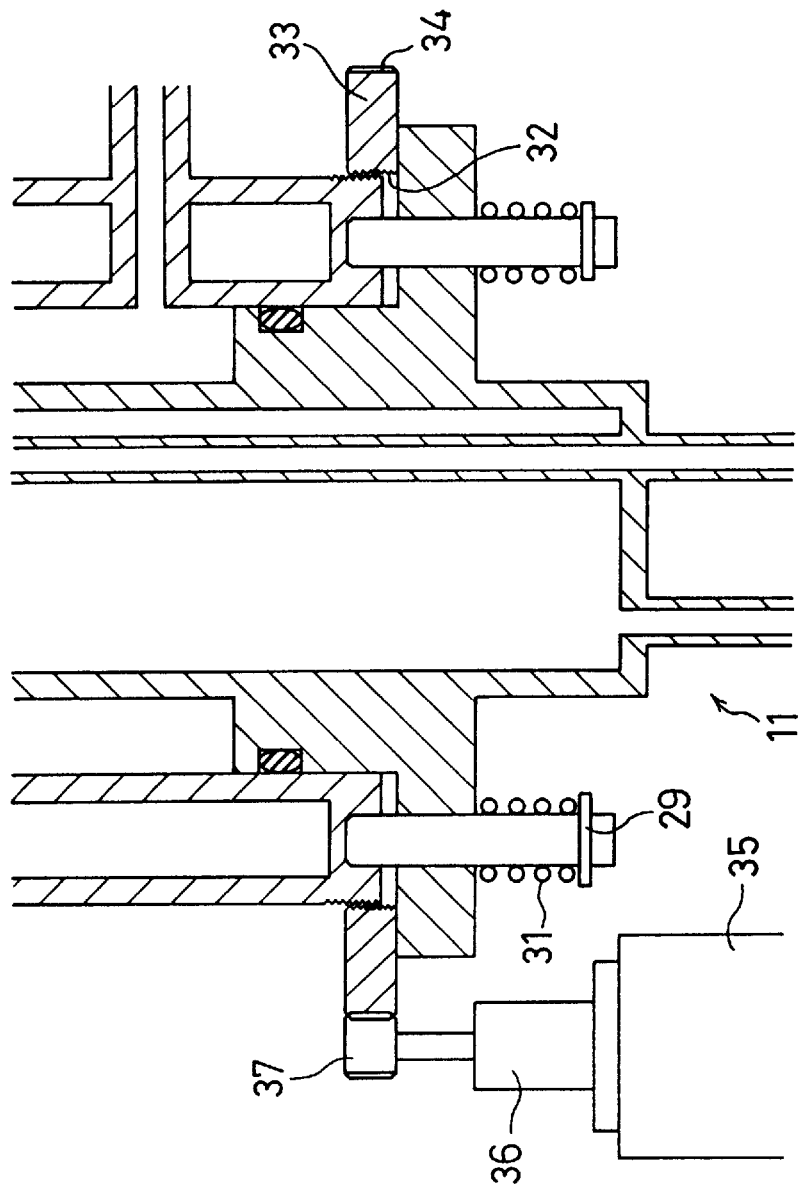
FIG. 8A is a similar view of still another embodiment of the vaporizer apparatus having a driver for the spacing adjustment mechanism.

FIGS. 7 and 8A show other embodiments of the apparatus enabling the dimension of the spacing $t_1$ to be changed depending on flow rates andphysicalproperties of the liquid feed material. The apparatus shown in FIG. 7 comprises an adjustment screw 30 with a guide pin 29 for adjusting the amount of spacing between a flange 28, which is formed on the outer surface of the bottom part of the inner shell section 11, and the bottom surface of the outer shell section 10. The guide pin 29 includes a spring 31 for biasing the flange 28 and the outer shell section 10 toward each other. A plurality of these guide pins 29 and the adjustment screws 30 are provided alternatingly around the circumference of the apparatus.

In this apparatus, when the adjustment screw 30 is turned, the inner shell section 11 moves so as to widen the spacing $t_1$, and the spacing $t_1$ is maintained by the biasing force of the spring 31. Although not shown in the drawing, it is possible to provide a separate screw to fix the dimension of the spacing $t_1$ after an adjustment has been carried out. In this design of the apparatus, the spacing $t_2$ between the drip nozzle 3 and the needle section 14 is also changed when altering the spacing $t_1$ between the opposed surfaces at the bottom part of the inner shell section 11. To adjust the two separately, an adjustment means may be provided separately in the supply section A, for example.

Figure 8B:
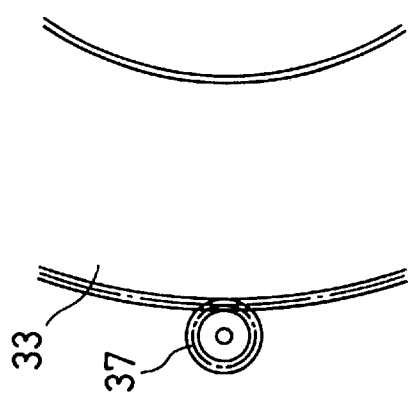
FIG. 8B is an enlarged partial plan view of the driver.

FIG. 8A shows a driving mechanism for adjusting the spacing $t_1$ so that the adjustment can be carried out quickly and precisely. Specifically, the inner shell section 11 and the outer shell section 10 are supported by the guide pins 29 and the springs 31 provided on the guide pins. Screw threads are provided on the outer surface of the outer shell section 10 and are coupled to a nut member 33 having a large diameter and teeth 34 on its peripheral surface. As shown in FIG. 8B, an electric motor 36 provided with reduction gears is mounted on fixed base 35 of the apparatus, and on the output shaft of the motor 36 is provided a gear 37 which is meshed with teeth 34 of the nut member 33.

By operating the drive motor 36, the inner shell section 11 moves vertically at a certain pace, thereby altering the spacing $t_1$ between the opposed surfaces and the spacing $t_2$ between the drip nozzle 3 and the needle section 14. As mentioned above, the supply section A can be arranged to move independently, and other types of driving means can be utilized.

Figure 9:
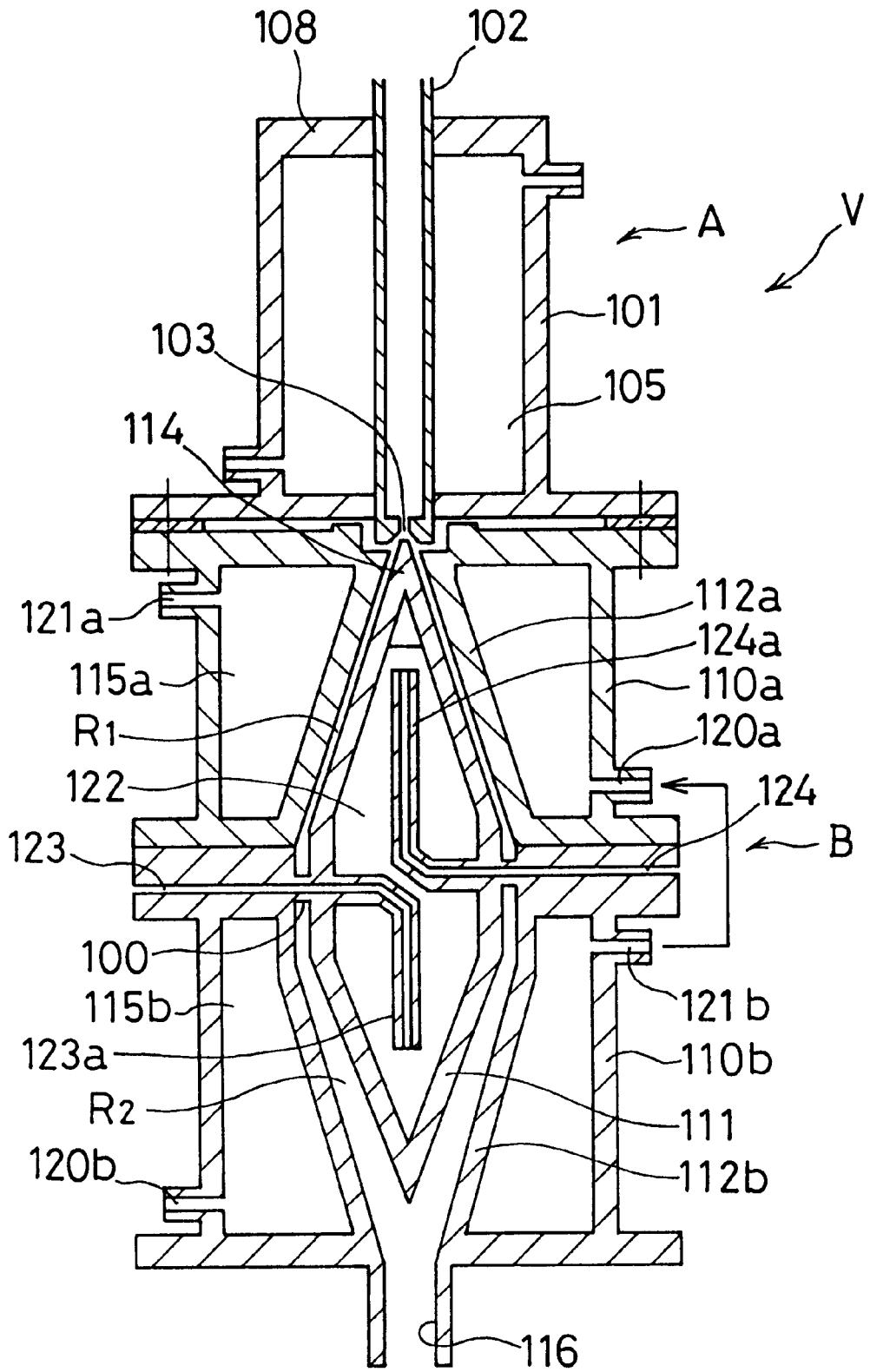
FIG. 9 is a cross sectional view of still another embodiment of the vaporizer apparatus of the present invention.

FIG. 9 is a vertical view section of a second embodiment of the vaporizer apparatus V in which vaporized gas outlet 116 is disposed coaxially with the flow path of the feed material in contrast to the right-angle arrangement of the vaporized gas outlet 16 adopted in the first embodiment. This arrangement reduces turbulent flow or stagnancy of vapor, and prevents precipitation induced by changes in the partial pressure of the feed vapor. This arrangement also provides a convenience in the attachment of the vaporizer apparatus depending on the location thereof. One example is shown later in which the vaporizer apparatus is integrated with an ejector nozzle apparatus.

In this vaporizer apparatus V, inner shell section 111 has a conical section at the top and bottom regions and the inside walls of outer shell section 112a, 112b are also shaped to conform with the conical shape. The vaporized gas outlet 116 is disposed in the central bottom region of the apparatus V. The outer shell sections 112a, 112b are separated into an upper and lower sections, and each section has its own jacket sections 115a, 115b for flowing a thermal medium by way of thermal medium passages 120a, 120b, 121a, 121b. First liquid vaporizing passage $R_1$ at the feed entrance side 103 has a spacing of about 0.3 but the spacing in a second liquid vaporizing passage $R_2$ at the exit side is made so that it gradually widens towards the liquid outlet.

The inner shell section 111 is also formed with a jacket section 122 and is supported by support sections 100 which extend towards the inner periphery of the outer shell section 112b through an intermediate liquid vaporizing passage between the first liquid vaporizing passage $R_1$ and the second liquid vaporizing passage $R_2$. The support sections 100 are provided with heating medium passages 123, 124 for supplying a heating medium to the inside of the jacket section 122. In this embodiment, the heating medium is supplied from an inlet piping 123a which extends towards the exit side within the heating jacket, and after the temperature of the heating medium is lowered, it ascends within the jacket 122 and exits from outlet piping 124a to the heating medium passage 124.

Figure 10:
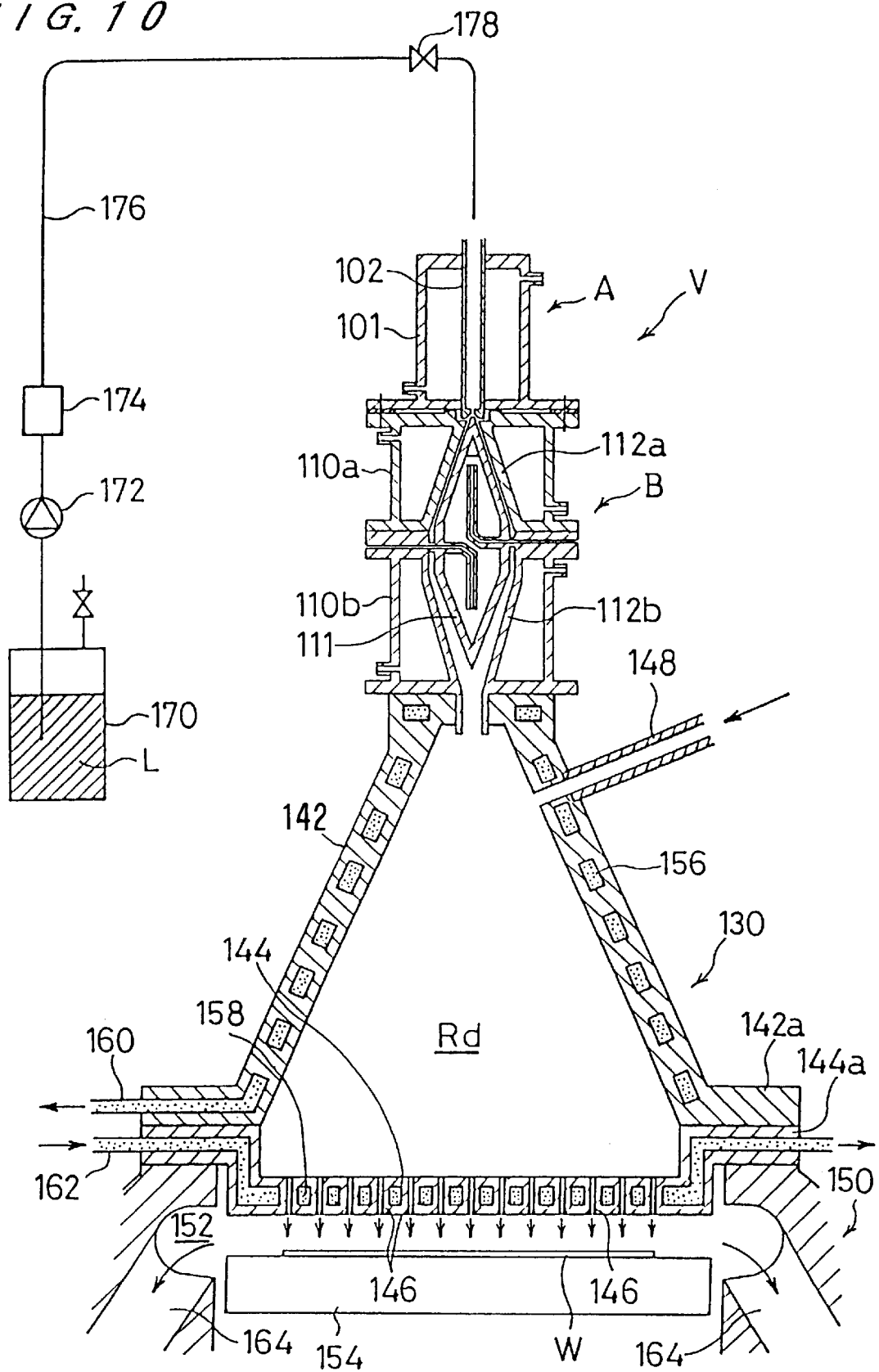
FIG. 10 is a cross sectional view of an integrated type of vaporizer apparatus having a vaporizer integrated with an ejector head.

FIG. 10 shows a vaporizer apparatus V having a vaporizer section, shown in FIG. 9, integrated with an ejector head 130 for jetting out a vaporized process gas towards a substrate disposed in a film deposition chamber 152. The ejector head 130 is comprised of an upper conical casing 142 and a nozzle plate 144 so as to define an internal reducer section Rd for rectifying the flow. The reducer section Rd is a part of the ejector head 130 which constitutes a pressure moderator to absorb the expansion of the vaporized gas to prevent a sudden pressure change, but also constitutes a mixing chamber to mix the liquid feed with a reactive gas before sending the mixed gas to nozzles 146 formed in the nozzle plate 144.

A reactive gas distribution pipe 148 for delivering a reactive gas (e.g., oxidizing gas) is disposed through the upper part of the casing 142. The reactive gas distribution pipe may be disposed evenly around the circumference or can be formed with an inner annular opening. The casing 142 and the nozzle plate 144 are attached to each other by way of flanges 142a, 144a, and is fixed to the upper portion of a vapor deposition chamber 150 for covering it. The nozzle plate 144 is spaced apart from substrate W, which is disposed on a pedestal 154, at a certain specific distance.

Throughout the interior spaces of the casing 142 and the nozzle plate 144, thermal medium passages 156, 158, respectively, are provided for flowing a thermal medium. The thermal medium passages 156, 158 are connected, through thermal medium distribution pipes 160, 162, to a thermal medium supply mechanism having a controller to control the temperature and/or flow rate of the thermal medium according to signals from sensors not shown. The casing 142 and the thermal medium distribution pipes 160, 162 may be surrounded with thermal insulation, as necessary.

The operation of the gas ejector apparatus in conjunction with the vaporizer apparatus will be described briefly. The liquid feed L contained in a feed container 170 is delivered by feed pump 172 to the vaporizer apparatus V, through feed pipe 176, and is vaporized. The vaporized gas is forwarded to the reducer section Rd, and its flow is conditioned by flowing in a gradually widening path and avoiding sudden pressure changes and turbulent flow in the process. After being mixed with the reactive gas, the mixed gas is ejected through the nozzles 146 of the nozzle plate 144 towards the substrate W, and the spent gas is discharged through spent gas exits 164.

In this arrangement of the gas ejector apparatus, the vaporized gas is introduced into the reducer section Rd to condition the gas flow pattern and then is ejected directly from the nozzles 146 so that there is little opportunity for the vaporized gas to degrade or produce precipitation to plug up the passages. Further, because all of the gas pathways are formed in an isothermal unit there is no temperature change so as to enable a thermodynamically stable supply of process gas to be delivered to the film deposit ion chamber 152. Thermal load on the system is relatively low because of the small surface area.

By providing that the reactive gas is introduced at the top portion of the reducer section Rd, it is efficiently mixed with the vaporized process gas by utilizing the expansion energy thereof while descending down the widening cross section of the reducer section Rd. The delivery of the mixed gas takes place through the nozzle plate 144 located at the bottom portion of the reducer section Rd, and the rectified flow of the mixed gas generated in the reducer section Rd is distributed uniformly to the nozzles 146 to enable production of a uniform distribution of process gas in the film deposition chamber 152.

Figure 11A:
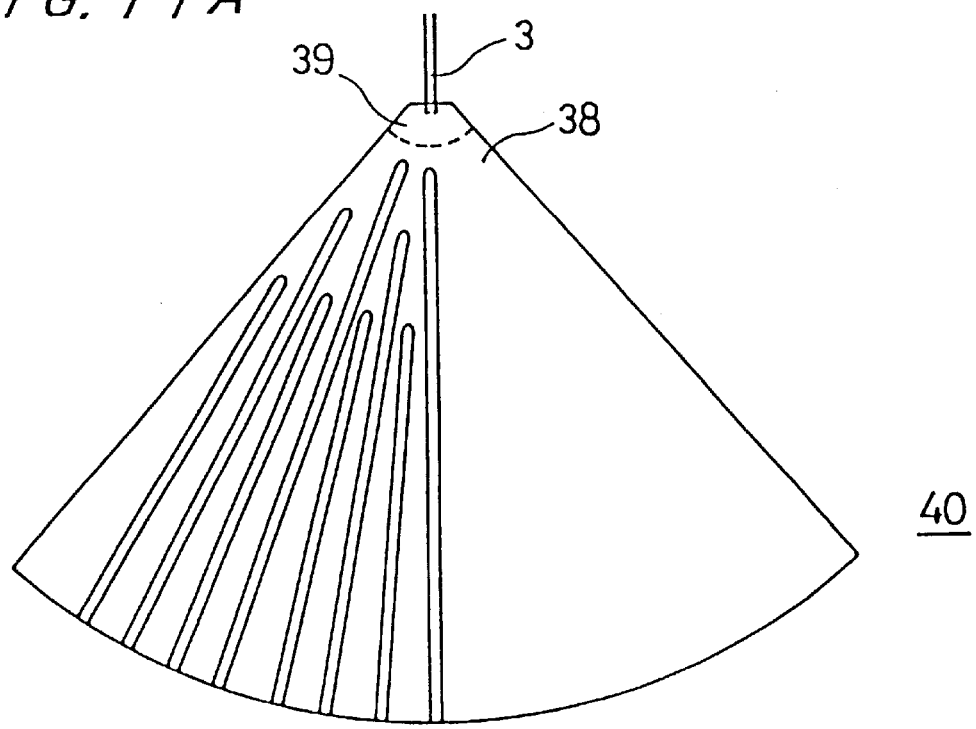
FIGS. 11A and 11B are schematic views of other examples of the needle section and bridging path sections of the vaporizer apparatus.
Figure 11B:
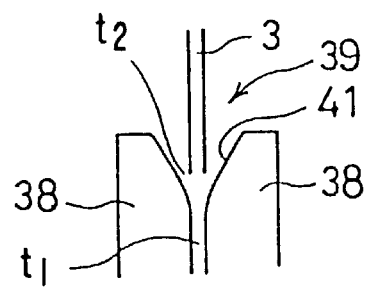

FIG. 11A and 11B show another example of the vaporizer section B having a vaporizing passage formed between a pair of parallel flat plates 38. This is an example of a fan-shaped vaporizer, and the feed enters through a feed entry opening 39 at a center region and exits through a feed exit opening 40 provided on the outer periphery. The parallel plates 38 are separated by a spacing $t_1$ as shown in FIG. 11B, and a heater jacket is provided on the exterior sides of the plates 38. The upper part comprises a supply section A and the lower part comprises a vaporizer section having a vaporized gas passage. The connecting section between the supply section A and the vaporizer section has a carrier gas mixing space similar to the embodiment shown in FIG. 1, and thermal conduction is controlled so that the supply section and the vaporizer section will not affect the performance of the liquid feed entry opening.

FIG. 11A also shows an example of the groove arrangement having an increasing number of grooves toward the feed exit opening 40 as in the case shown in FIG. 3. The cross sectional view of the feed entry opening 39 is shown in FIG. 11B, and it has a V-shaped guide section 41 above the vaporizing passage having the narrow spacing $t_1$, which faces the tip of the drip nozzle 3 through a spacing $t_2$. The transition from the guide section 41 to the vaporizing passage has smooth curved surfaces.

This example is presented to show that flat plate heating configurations are equally effective in producing a uniform quality gas by providing rapid heating and fine control of the liquid feed flow rates. This type of planar design allows the whole apparatus to be simple so that production costs can also be lowered. The installation space required is small and the overall apparatus can be made compact. The shape of the parallel plates 38 need not be limited to a fan-shape, and other shapes such as circle- or rectangular-shaped vaporizer sections are also employable.

Figure 12A:
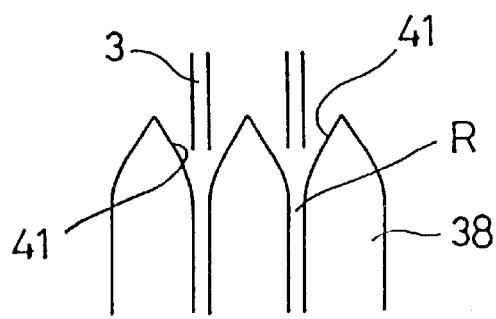
FIGS. 12A and 12B are schematic views of other examples of the bridging path sections.
Figure 12B:
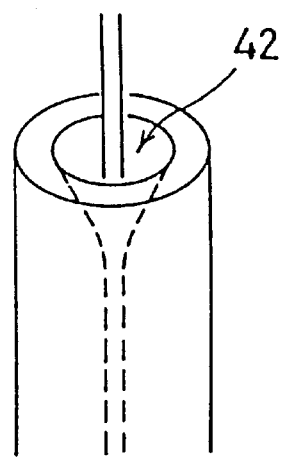

FIGS. 12A and 12B show other examples of the construction of the feed entry part of the apparatus. FIG. 12A shows a series of parallel plates 38 and FIG. 12B shows a funnel-shaped guide section 42. The funnel-shaped guide section can be utilized with the vaporizer section of any of the apparatus shown in FIGS. 1, 9 or 11A, 11B.

What is claimed is:

1. An apparatus for vaporizing a liquid feed material, said apparatus comprising:
   a pair of opposed walls separated by a minute spacing defining a vaporizing passage having first and second ends;
   a liquid feed material entrance at said first end of said vaporizing passage to introduce liquid feed material into said vaporizing passage;
   heating means for heating said pair of walls to a temperature in excess of a vaporizing temperature of the liquid feed material, to thereby vaporize the liquid feed material in said vaporizing passage to form vaporized feed;
   a vaporized feed outlet at said second end of said vaporizing passage for discharging the vaporized feed from said vaporizing passage; and
   a width of said minute spacing defining said vaporizing passage being such that the liquid feed material is introduced continually into said vaporizing passage as a thin film on said opposed walls by capillary action.

2. An apparatus as claimed in claim 1, wherein at least one of said walls has grooves defining flow channels for passage therethrough of the vaporized feed.

3. An apparatus as claimed in claim 2, wherein a total cross-sectional area of said grooves increases in a direction from said first end of said vaporizing passage to said second end thereof.

4. An apparatus as claimed in claim 2, further comprising a carrier gas supply for introducing carrier gas into said vaporizing passage such that the carrier gas passes through said grooves.

5. An apparatus as claimed in claim 1, wherein a cross-sectional area of said vaporizing passage increases in a direction from said first end thereof to said second end thereof.

6. An apparatus as claimed in claim 1, further comprising a spacing adjusting mechanism for adjusting said width of said minute spacing.

7. An apparatus as claimed in claim 6, further comprising a driving mechanism for operating said spacing adjusting mechanism.

8. An apparatus as claimed in claim 1, further comprising a carrier gas supply communicating with said liquid feed material entrance for supplying thereto a carrier gas.

9. An apparatus as claimed in claim 1, wherein said opposed walls have confronting curved surfaces defining said vaporizing passage.

10. An apparatus as claimed in claim 9, wherein said curved surfaces are conical.

11. An apparatus as claimed in claim 9, wherein said curved surfaces are cylindrical.

12. An apparatus as claimed in claim 9, wherein said curved surfaces include a combination of conical surfaces and cylindrical surfaces.

13. An apparatus as claimed in claim 1, wherein said opposed walls have confronting planar surfaces defining said vaporizing passage.

14. An apparatus as claimed in claim 1, wherein said width of said minute spacing is no greater than 0.3 mm.

15. An apparatus as claimed in claim 1, wherein said liquid feed material entrance includes a feed guide for guiding the liquid feed material into said vaporizing passage.

16. An apparatus as claimed in claim 1, further comprising a liquid feed supply passage for supplying the liquid feed material to said liquid feed material entrance.

17. An apparatus as claimed in claim 16, wherein said liquid feed supply passage has a lower end that opens at a position spaced above said liquid feed material entrance.

18. An apparatus as claimed in claim 16, wherein said liquid feed supply passage has a delivery end that is spaced from said liquid feed material entrance by a spacing of a dimension small enough to insure that liquid feed material discharged from said delivery end forms due to surface tension a continuous bridge of liquid feed material between said delivery end and said liquid feed material entrance.

19. An apparatus as claimed in claim 18, wherein said dimension is sufficient to prevent formation of drops of the liquid feed material upon discharge thereof from said delivery end.

20. An apparatus as claimed in claim 19, further comprising a spacing adjustment mechanism for adjusting said dimension of said spacing.

21. An apparatus as claimed in claim 20, further comprising a driving mechanism for operating said spacing adjustment mechanism.

22. An apparatus as claimed in claim 19, wherein said liquid feed supply passage comprises a small diameter tube having a tip end defining said delivery end, and one of said opposed walls defines a needle shape directed toward said tip end.

23. An apparatus as claimed in claim 22, wherein said tip end has the shape of a cylindrical nozzle.

24. An apparatus as claimed in claim 22, wherein said small diameter tube has an inner diameter of not more than 2 mm.

25. An apparatus as claimed in claim 1, wherein said opposed walls have surface characteristics to promote wettability thereof by the liquid feed material.

26. An apparatus as claimed in claim 1, wherein said liquid feed material entrance is positioned above said vaporizing passage, and said vaporized feed outlet is positioned below said vaporizing passage.

27. An apparatus as claimed in claim 1, wherein said liquid feed material entrance and said vaporized feed outlet are positioned substantially coaxially.

28. An apparatus as claimed in claim 1, further comprising an ejector head for directing the vaporized feed to a substrate to be coated thereby, said ejector head being positioned to receive the vaporized feed from said vaporized feed outlet.

29. An apparatus as claimed in claim 28, wherein said ejector head includes ejector nozzles for ejecting the vaporized feed toward the substrate, and a reducer section between said vaporized feed outlet and said ejector nozzles to avoid pressure changes of the vaporized feed therebetween.

30. An apparatus as claimed in claim 1, further comprising a source of the liquid feed material, a feed flow passage extending from said source to said liquid feed material entrance, and a vaporization prevention mechanism positioned upstream of said vaporizing passage for preventing vaporization of the liquid feed material in said feed flow passage.

31. An apparatus as claimed in claim 30, wherein said vaporization prevention mechanism includes an insulation connection between said feed flow passage and said vaporization passage.

32. An apparatus as claimed in claim 30, wherein said vaporization prevention mechanism includes a temperature control jacket surrounding a portion of said feed flow passage upstream of said vaporization passage.

33. An apparatus for vaporizing a liquid feed material including at least one material substance and a solvent, said apparatus comprising:

a vaporizing passage having a liquid feed material entrance;

a feed supply passage for supplying the liquid feed material to said liquid feed material entrance and into said vaporizing passage;

heating means for heating said vaporizing passage to a temperature in excess of a vaporizing temperature of the liquid feed material, to thereby vaporize the liquid feed material in said vaporizing passage; and an insulation section for maintaining said feed supply passage at a temperature low enough to maintain both the material substance and the solvent of the liquid feed material in said feed supply passage in sufficiently stable condition to prevent vaporization thereof.

34. An apparatus as claimed in claim 33, wherein said feed supply passage is separated from said liquid feed material entrance by a space, and said heating means and said insulation section are joined along peripheries thereof surrounding said liquid feed material entrance.

35. An apparatus as claimed in claim 33, wherein said insulation section is at a temperature that is close to but lower than said temperature of said vaporizing passage.

36. An apparatus as claimed in claim 33, further comprising an insulated connection between said vaporizing passage and said insulation section.

37. An apparatus for vaporizing a liquid feed material, said apparatus comprising:

a feed supply section for supplying the liquid feed material at a predetermined rate while maintaining the liquid feed material at a temperature below a vaporization temperature thereof;

a vaporizer section for vaporizing the liquid feed material supplied from said feed supply section by heating the thus supplied liquid feed material to a temperature in excess of said vaporization temperature;

an outlet of said feed supply section being spaced from said vaporizer section by a spacing of a dimension small enough to insure that liquid feed material discharged from said feed supply section forms due to surface tension a continuous bridge of liquid feed material between said feed supply section and said vaporizer section and to prevent the formation of droplets of liquid feed material therebetween.

38. An apparatus as claimed in claim 37, further comprising a carrier gas supply for supplying carrier gas to contact the liquid feed material at the continuous bridge thereof.

39. An apparatus as claimed in claim 37, further comprising a spacing adjustment mechanism for adjusting said dimension of said spacing.

40. An apparatus as claimed in claim 39, further comprising a driving mechanism for operating said spacing adjustment mechanism.

41. An apparatus as claimed in claim 37, wherein said feed supply section comprises a small diameter tube having a tip end defining said delivery end, and one of said opposed walls defines a needle shape directed toward said tip end.

42. An apparatus as claimed in claim 41, wherein said tip end has the shape of a cylindrical nozzle.

43. An apparatus as claimed in claim 41, wherein said small diameter tube has an inner diameter of not more than 2 mm.

44. An apparatus as claimed in claim 37, wherein said vaporizer section includes a liquid guide at a position whereat the continuous bridge is formed, said liquid guide having a cross-sectional area that decreases in a downstream direction.

45. An apparatus for vaporizing a liquid feed material, said apparatus comprising:

a pair of opposed walls having confronting cylindrical surfaces separated by a minute spacing defining a vaporizing passage having first and second ends;

a liquid feed material entrance at said first end of said vaporizing passage to introduce liquid feed material into said vaporizing passage;

heating means for heating said pair of walls to a temperature in excess of a vaporizing temperature of the liquid feed material, to thereby vaporize the liquid feed material in said vaporizing passage to form vaporized feed; and at least one of said walls having grooves defining flow channels for passage therethrough of the vaporized feed.

* * * * *